(12) United States Patent
Yang

(10) Patent No.: US 6,883,698 B1
(45) Date of Patent: Apr. 26, 2005

(54) PLANTING DEVICE FOR PLANTING SOLDER BALLS ONTO A CHIP

(75) Inventor: Chun-Wei Yang, Tao-Yuan (TW)

(73) Assignee: High Tech Computer Corp., Tao-Yuan (TW)

( * ) Notice: Subject to any disclaimer, the term of this patent is extended or adjusted under 35 U.S.C. 154(b) by 98 days.

(21) Appl. No.: 10/249,456

(22) Filed: Apr. 11, 2003

(30) Foreign Application Priority Data

Aug. 16, 2002 (TW) .......................................... 91118592 A

(51) Int. Cl.⁷ ................................................. B23K 1/00
(52) U.S. Cl. ........................... 228/41; 228/49.5; 29/843
(58) Field of Search ........................ 228/41, 49.5, 245, 228/246; 29/840, 843; 438/613–617; 257/737, 738

(56) References Cited

U.S. PATENT DOCUMENTS

| | | | | |
|---|---|---|---|---|
| 5,839,191 A | * | 11/1998 | Economy et al. | 29/843 |
| 5,921,458 A | * | 7/1999 | Fan | 228/41 |
| 6,003,757 A | * | 12/1999 | Beaumont et al. | 228/246 |
| 6,253,992 B1 | * | 7/2001 | Fjelstad | 228/245 |
| 6,268,275 B1 | * | 7/2001 | Cobbley et al. | 438/612 |
| 6,276,598 B1 | * | 8/2001 | Cheng et al. | 228/245 |
| 2002/0166886 A1 | * | 11/2002 | Inoue et al. | 228/245 |

\* cited by examiner

*Primary Examiner*—Jonathan Johnson
(74) *Attorney, Agent, or Firm*—Winston Hsu

(57) ABSTRACT

A planting device for planting solder balls onto a chip includes a main board with a plurality of apertures for accommodating solder balls, and a fixture for fixing the chip under the main board. The chip is coated with a layer of adhesive for adhering the solder balls accommodated inside the apertures onto the chip.

12 Claims, 6 Drawing Sheets

PLANTING DEVICE FOR PLANTING SOLDER BALLS ONTO A CHIP

BACKGROUND OF INVENTION

1. Field of the Invention

The invention relates to a planting device, and more particularly, to a planting device for planting a plurality of solder balls on a chip.

2. Description of the Prior Art

In recent years, along with the fast development of electronic technology accompanied with the appearances of LSI, VLSI, and ULSI, the density of a silicon chip has risen continuously. Due to the I/O foot-number drastically increasing, the power that each silicon chip consumes has also increased. Therefore, the conventional dual in-line package (DIP) and the quad flat package (QFP) cannot always satisfy physical requirements anymore. The presence of the ball grid array package (BGA Package) then filled up this gap.

Please refer to FIG. 1. FIG. 1 is a cross-sectional diagram of a ball grid array package 10 of the prior art. The ball grid array package 10 comprises a substrate 12. The substrate 12 comprises a Cu trace layer 6 installed under the substrate 12, a plurality of solder ball pads 14 installed on the surface of the Cu trace layer 16, and a solder mask 18 covered on the surface of the Cu trace layer 16 beyond the solder ball pad 14. The solder ball pad 14 is installed on the surface of the Cu trace layer 16, making use of the solder mask 18 as the isolation layer. After the ball grid array package 10 is achieved, a plurality of solder balls 20 are used to fix the package 10 on a printed circuit board (PCB) 22 so that the ball grid array package 10 and the printed circuit board 22 can be electrically connected to each other. The ingredients of the solder ball is an alloy of 63% tin and 37% lead.

The main advantages of the ball grid array package are:
1) Although the I/O foot-numbers of the ball grid array package increase, the spacing between each foot of the ball grid array package is far larger than the spacing between each foot of the QFP, thereby raising the yield rate of the completed products;
2) The foot-numbers of the ball grid array package per unit area are higher than the foot-numbers of the QFP per unit area. That is, if the foot-numbers of the ball grid array package are the same as those of the QFP, the area of the ball grid array package will be smaller than the area of QFP;
3) Comparing with the QFP, the power dissipation of the ball grid array package is larger. However, the ball grid array package can make use of the welding method of the Controlled-Collapse-Chip Connection, which can be briefly called the C4 welding, to improve the electrical performance of the ball grid array package;
4) Comparing with the QFP, the thickness of the ball grid array package is less shallow than half the thickness of the QFP, and the weight of the ball grid array package can also be reduced to three-fourths of the weight of the QFP;
5) The ball grid array package can apply to a higher frequency band compared to the QFP;
6) The ball grid array package adoptscoplanar welding so that the firmness of on the printed circuit board is better than the firmness of the QFP on the printed circuit board.

However, the ball grid array package of the prior art also leaves something to be improved. For example, when a printed circuit board is sent for repairs, the repairer can easily dissemble or integrate the QFP on the printed circuit board with his hands or with simple instruments. However, with the ball grid array package on the printed circuit board, the repairing procedure is not that simple. The repairer has to heat the printed circuit board to a certain temperature to melt a plurality of solder balls, which are used for adhering the ball grid array package onto the printed circuit board, in order to dissemble the ball grid array package from the printed circuit board. Regarding the re-integration of the ball grid array package to the printed circuit board, the procedure is a more troublesome matter. The repairer needs to plant a plurality of solder balls one by one on the surface of the ball grid array package. Generally speaking, a skillful repairer needs to take 10 to 15 minutes on average for planting all the solder balls one by one on all the solder ball pads on the surface of the ball grid array package. This planting work by hand not only wastes time, but also cannot assure that each solder ball planted to the ball grid array package will be accurately planted on the corresponding solder ball pad since the repairer's eyes will be tired after staring at the ball grid array package for long time.

SUMMARY OF INVENTION

It is therefore a primary objective of the claimed invention to provide a planting device to solve the above-mentioned problems. The planting device of the claimed invention can quickly and accurately plant a plurality of solder balls onto their corresponding positions on the surface of the ball grid array package.

According to the claimed invention, the planting device of the claimed invention can plant a plurality of solder balls onto a chip. The planting device comprises a main board and a fixture. A plurality of apertures are installed on the main board, and each aperture is used to accommodate a solder ball. The fixture is used to fix the chip underneath the main board, and the chip is coated with a layer of adhesive for adhering the solder balls inside the apertures onto the chip.

These and other objectives of the present invention will no doubt become obvious to those of ordinary skill in the art after reading the following detailed description of the preferred embodiment, which is illustrated in the various figures and drawings.

DETAILED DESCRIPTION

Figure 1:
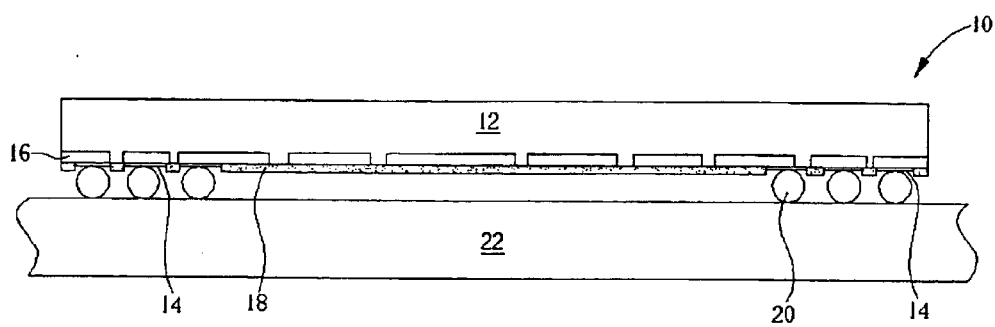
FIG. 1 is a cross-sectional diagram of the ball grid array package of the prior art.
Figure 2:
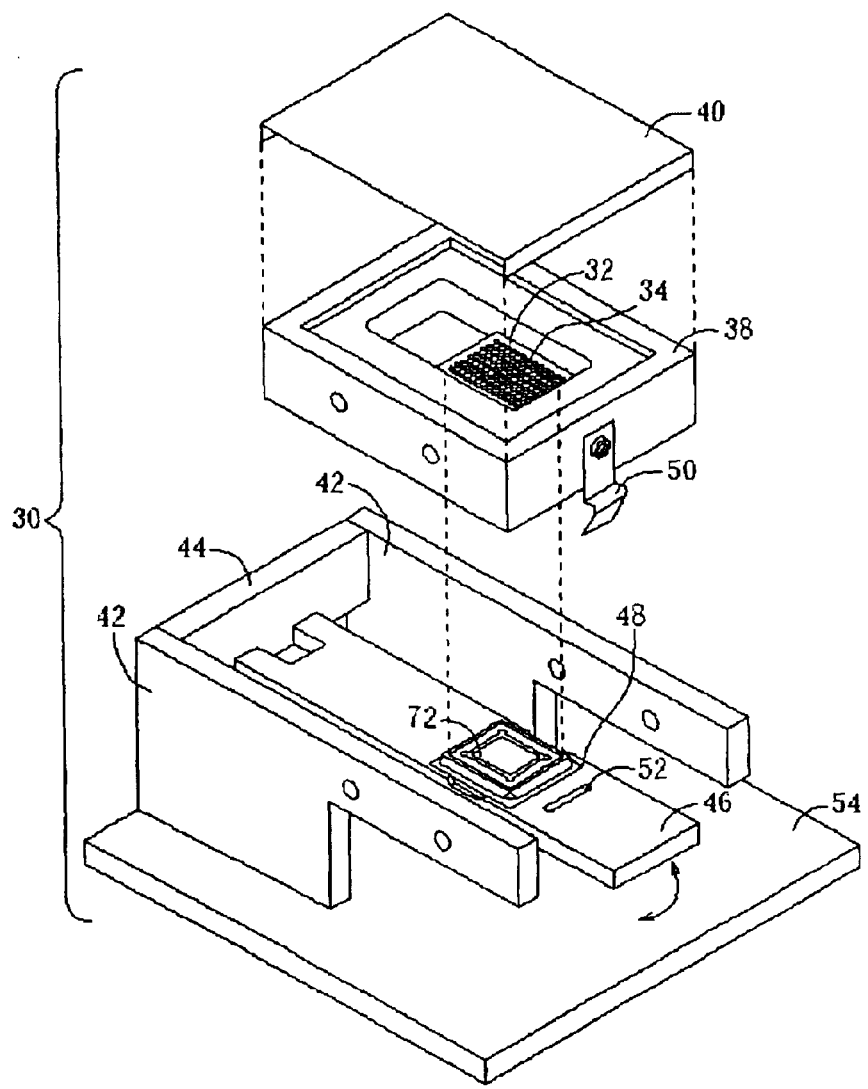
FIG. 2 is a schematic diagram of a planting device of the present invention.
Figure 3:
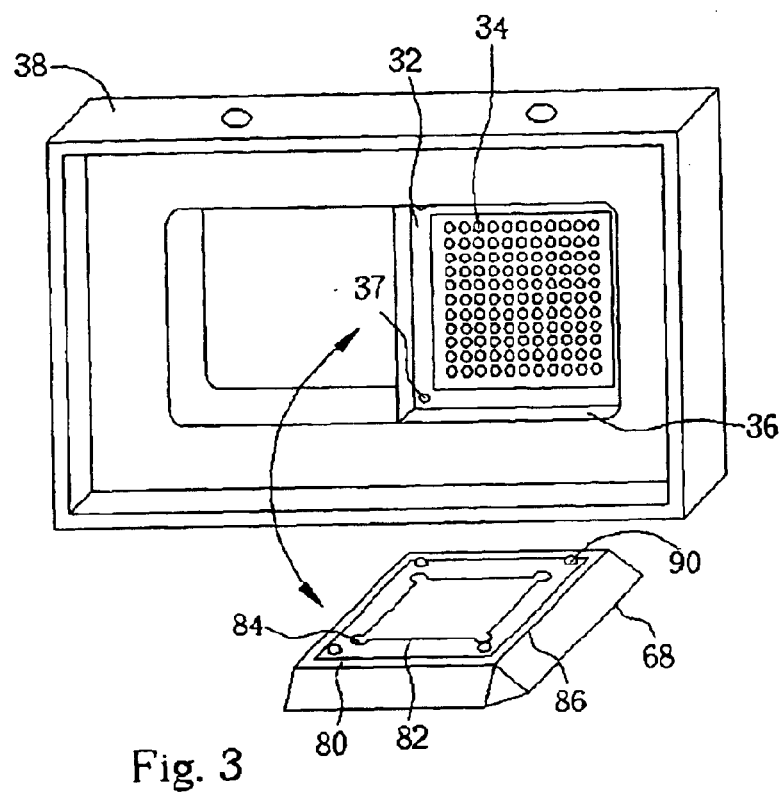
FIG. 3 is a schematic diagram of a fixture and a chip carrier of the planting device as shown in FIG. 2.

Please refer to FIG. 2. FIG. 2 is a schematic diagram of a desktop planting device 30 of the present invention. The planting device 30 is used to adhere a plurality of solder balls with diameters between 0.35 and 0.7 mm onto a chip 72, which is coated with a thin layer of adhesive as the flux for adhering the solder balls planted by the planting device 30 onto the chip 72. The planting device 30 comprises a main board 32 installed with a plurality of apertures that accommodate the solder balls, a fixture 36 as shown in FIG. 3, installed underneath the main boards 32 for fixing the chip 72 underneath the main board 32 in order to insure that the positions of a plurality of apertures 34 on the main board 32 accurately correspond to the correct planting positions on the chip 72, and a solder ball carrier 38 for carrying a plurality of solder balls. The position of each aperture on the main board 32 corresponds to the correct position on the chip 72 in which the solder ball should be planted. The solder ball carrier 38 can accommodate 2,000–3,000 solder balls, and the height or area of the solder ball carrier 38 can be adjusted with different carrying quantities according to the practical situations. The main board 32 is installed in the first end of the solder ball carrier 38 in the planting device 30 for accommodating the solder balls sliding from the other end of the solder ball carrier 38 with a plurality of apertures 34 when the solder ball carrier 38 is shaken or tilted. The height of the second end of the solder ball carrier 38 is slightly lower than the height of the main board 32 in order to let extra solder balls slide back from the main board 32 after the end of the planting procedure.

The planting device 30 comprises a dust keeper 40 detachably installed on the solder ball carrier 38. When the solder balls are carried into the solder ball carrier 38, the dust keeper 40 is open. After the solder ball carrier 38 is filled up with the solder balls, the dust keeper 40 is closed in order to prevent dust from entering the solder ball carrier 38. The planting device 30 further comprises a pair of supporting frames 42 for supporting and fixing the solder ball carrier 38, a base 54 for fixing the supporting frame 42 on itself, a connecting device 44 fixed in one end of the supporting frame 42, and a lever plate 46. The lever plate 46 comprises a first end and a second end. The first end of the lever plate is rotatably connected to the connecting device 44, and the second end is not connected to the connecting device 44. The lever plate 46 further comprises a chip base 48, which is installed with a chip carrier 80(A more detailed diagram is shown in FIG. 3) for carrying the chip 72. The chip base 48 is used to preliminarily place the chip 72 so that the chip 72 can be accurately positioned inside the fixture 36 underneath the main board 32 when the second end of the lever plate 46 is raised to a height so that the lever plate 46 is adjacent to the solder ball carrier 38. An elastic slice 50 is installed outside the solder ball carrier 38, and an elastic slice hole 52 is installed on the lever plate 46. When the lever plate 46 is adjacent to the solder ball carrier 38, the elastic slice 50 can be plugged into the elastic slice hole 52 elastically for fixing the lever plate 46 underneath the solder ball carrier 38.

Figure 4:
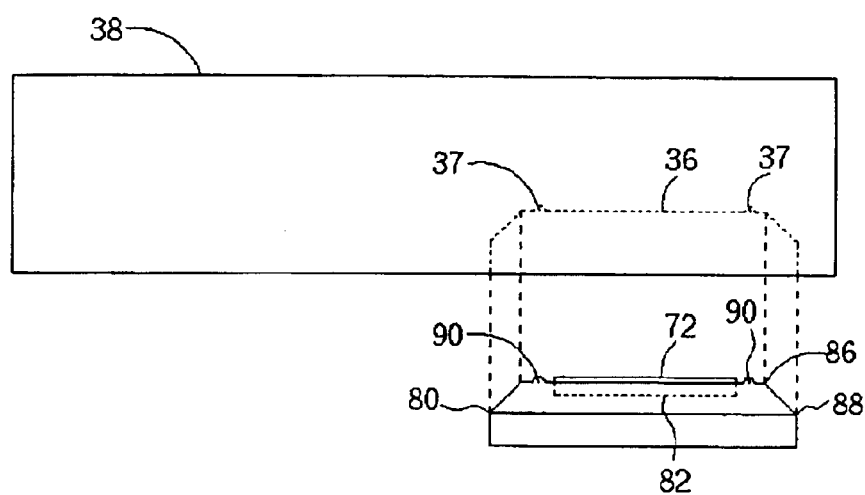
FIG. 4 is a side-view perspective of the fixture and the chip carrier of the planting device as shown in FIG. 2.

Please refer to FIG. 3 and FIG. 4. FIG. 3 is a detailed schematic diagram of the fixture 36 and the chip carrier 80 of the planting device 30 as shown in FIG. 2. FIG. 4 is a side-view perspective of the fixture 36 and the chip carrier 80 of the planting device 30. The chip carrier 80 comprises a chip holder 82, whose shape and size are identical to the shape and size of the chip 72 and whose depth should be slightly less shallow than the thickness of the chip 72 so that the chip 72 in the chip carrier 80 is able to be adjacent to the bottom of the main board 32 when the lever plate 46 is adjacent to the solder ball carrier 38. Moreover, the planter can easily take the chip 72 from the chip holder 82 quickly after the whole planting procedure is finished. The chip holder 82 comprises four chip extracting holes 84 respectively disposed on four corners of the chip holder 82 so that the planter can quickly take the chip 72 from the chip holder 82. The chip carrier 80 is a four-sided taper with a funnel shape, that is, each side of the first periphery 86 on the chip carrier 80 is parallel with the corresponding side of the second periphery 88. Moreover, the circumference of first periphery 86 is smaller than the circumference of the second periphery 88, and the shape inside the fixture 36 corresponds to the shape of the chip carrier 80. Therefore, the chip carrier 80 can be accurately inserted into the fixture 36. Please refer to FIG. 3. The chip carrier 80 further comprises a plurality of convex dots 90 installed in the surroundings of a surface by which the chip carrier 48 is adjacent to the fixture 36. The fixture 36 comprises a plurality of cave holes 37 corresponding to the plurality of convex dots 90, and the function of the convex dots 90 and cave holes 37 is to accurately position the chip carrier 80 inside the fixture 36 when the chip carrier 80 is inserted into the fixture 36. The plurality of convex dots 90 also can be installed on the chip carrier 80. Certainly, the plurality of cave holes 37 corresponding to the plurality of convex dots 90 have to be installed inside the fixture 36. The quantity of the convex dots (and the quantity of the cave holes 37), the spacing between each convex dot 90 (and the spacing between each cave hole 37), and the size of the convex dots 90 (and the size of the cave hole 37) can be adjusted according to the physical circumstances.

The repairer can make use of the planting device 30 of the present invention to quickly adhere a plurality of solder balls onto a chip. First, the chip is placed inside the chip holder 82 in the chip carrier 80 on the chip base 48 of the lever plate 46, and the surface coated with the flux is placed upward. After the second end of the lever plate 46 is raised from the position of the base 54 to the position by which the surface of the chip can be adjacent to the bottom of the main board 32, the elastic slice 50 on the solder ball carrier 38 is plugged into the elastic slice hole 52 of the lever plate 46 for fixing the lever plate 46 underneath the solder ball carrier 38. After the dust keeper 40 is opened to inject 2,000 to 3,000 solder balls into the solder ball carrier 38, the dust keeper 40 is closed to insure that impurities such as dust will not tamper the adherence rate of the solder balls when a plurality of solder balls is adhered onto the chip. When all of the apparatuses are settled down, the solder ball carrier 38 can be shook, or one end of the planting device 30 can be lifted to make a plurality of solder balls inside the solder ball carrier 38 cover the plurality of apertures 34 of the main board 32. Once each aperture 34 accommodates a solder ball, the planting device 30 can cease being shaken, or the lifted end of the planting device 30 can be lowered. Afterwards, the elastic slice 50 is pulled out from the elastic slice hole 52, and the second end of the lever plate 46 is placed on the base 54 so as to take out the chip from the chip holder 82 in the chip carrier 80. At this moment, all the positions on the chip to be planted with the solder balls are all planted with the solder balls. Utilizing the planting device 30 of the present invention reduces the whole planting procedure to 10 to 15 seconds. Furthermore, after being slightly trained, anyone can make use of the planting device 30 to undertake the planting task.

Figure 5:
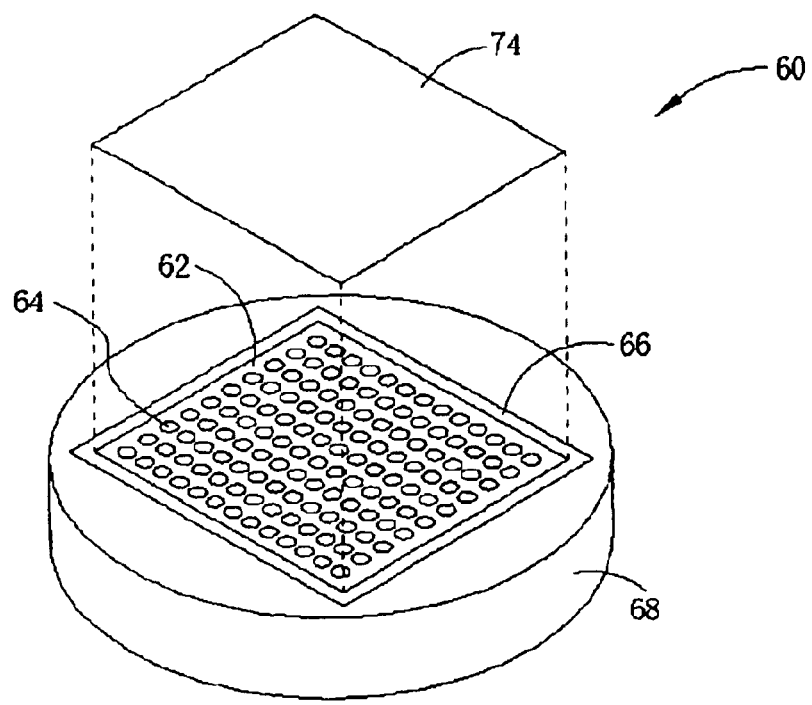
FIG. 5 is a schematic diagram of another planting device of the present invention.
Figure 6:
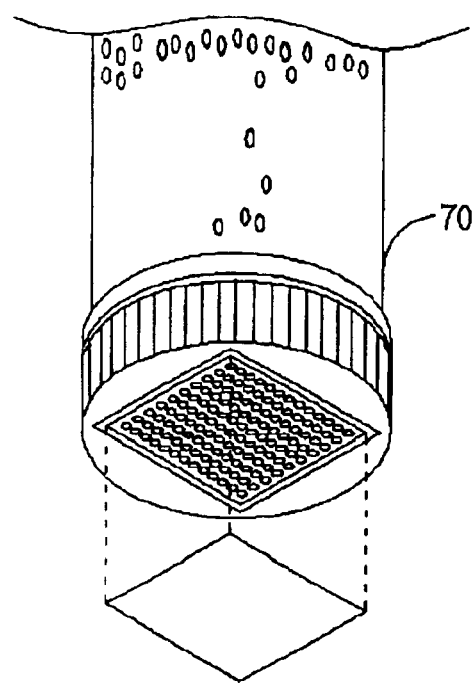
FIG. 6 is a schematic diagram showing connection between the planting device as shown in FIG. 4 and a container carrying a plurality of solder balls.

Please refer to FIG. 5 and FIG. 6. FIG. 5 is a schematic diagram of another handheld planting device 60 of the present invention, and FIG. 6 is a schematic diagram showing the connection between the planting device 60 as shown in FIG. 5 and the container carrying a plurality of solder balls. The planting device 60 comprises a main board 62 installed with a plurality of apertures 64. Each aperture 64 is used to accommodate a solder ball, and the position of each aperture 64 corresponds to the correct position on the chip 74 in which the solder ball should be planted. The planting device 60 further comprises a fixture 66 installed on the main board 62 for fixing the chip 74 on the main board 62 to insure that the positions of a plurality of apertures 64 on the main board 62 accurately correspond to the correct planting positions on the chip 74. The planting device 60 comprises a container connector 68 installed on the main board 62 for being connected to a container 70 accommodating a plurality of solder balls 70 as shown in FIG. 6. When the repairer would like to make use of the planting device 60 to adhere a plurality of solder balls on the surface of the chip 74, the repairer can place the chip 74 inside the fixture 66 of the planting device 60. The surface of the chip 74 with the adhesive is placed inward, and the other surface without the adhesive is placed outward. The chip 74 has to be supported with simple instruments or just by hand in order to prevent the chip 74 from sliding from the planting device 60. Afterwards, the repairer can connect the open gate of the container 70 accommodating a plurality of solder balls to the container connector 68 of the planting device 60. Then the bottom of the container 70 is lifted upward, and the container 70 is slightly shaken in order to spread the solder balls inside the container 70 onto the main board 62. After each aperture 64 of the main board 62 accommodates a solder ball, the bottom of the container 70 can be placed downward, and the chip 74 can be taken out from the fixture 66. The positions on the chip 74 to be planted with the solder balls are all planted with the solder balls at this moment. The above-mentioned planting procedure by the planting device 60 will not take more than 5 seconds. Please notice that the depth of the fixture 66 should not exceed the thickness of the chip 74 in order to quickly take the chip 74 from the fixture 66 after the whole planting procedure finishes.

On the main board of the planting device of the present invention, the number of the apertures, the alignment of the apertures, and the spacing between each aperture can be adjusted according to various ball grid array packages. Moreover, the fixture of the planting device also can be adjusted. Besides, the planting device of the present invention is mainly used to attach a plurality of solder balls on the repaired chip, that is, the chip is not a whole new one. Certainly, the user also can make use of the planting device of the present invention to plant a plurality of solder balls on the whole new chip. Furthermore, the first end of the lever plate 46 of the embodiment as shown in FIG. 2 is rotatably connected to the connecting device 44. However, the design of the lever plate 46 is beyond the above-mentioned region. As long as the lever plate 46 can be used to carry a chip and to move the chip below the fixture 36 so that a plurality of solder balls can be accurately planted on the chip, the design of the lever plate 46 belongs to the region of the invention.

In contrast to the method of the prior art to plant the solder balls one by one on the surface of the ball grid array package by hand, the planting device of the present invention at least has the following advantages: First, the operations of the planting device are quite simple, and anyone can easily learn how to use the present invention only after being slightly trained. Second, since the user of the planting device of the present invention does not need to stare at the ball grid array package, the eyes of the user do not get as tired. Therefore, the user does not need to rest per period of planting time. Third, since the main board and the fixture of the planting device of the present invention are designed to insure that the solder balls can be planted accurately on the surface of the ball grid array package, the planting device can accurately and simultaneously plant a plurality of solder balls on the surface of the ball grid array package. Fourth, planting a plurality of solder balls onto a chip with the planting device of the present invention only takes about 10 to 15 seconds, which is much shorter than the time of 10 to 15 minutes in the prior art. The fourth point is the most important advantage of the present invention, and allows for greater productivity.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A planting device for planting solder balls onto a chip comprising:

a main board installed with a plurality of apertures, each aperture for accommodating one solder ball;

a fixture for fixing the chip under the main board;

a solder ball carrier for carrying solder balls, the main board being disposed on an end of the carrier and capable of accommodating the solder balls sliding from the solder ball carrier with the plurality of apertures when the carrier is shaking;

a supporting frame for supporting the solder ball carrier;

a connecting device fixed to an end of the supporting frame; and a lever plate having a first end and a second end, the first end of the lever plate rotatably connecting to the connecting device, the lever plate installed with a chip base for placing the chip therein and for positioning the chip, so that the chin can be accurately positioned inside the fixture when the second end of the lever plate is raised to a height so that the lever plate is adjacent to the solder ball carrier;

wherein the chip is coated with a layer of adhesive for adhering the solder balls accommodated inside the apertures onto the chip.

2. The planting device of claim 1 wherein a position of the solder ball carrier is slightly lower than a position of the main board.

3. The planting device of claim 1 further comprising a dust keeper detachably installed on the solder ball carrier.

4. The planting device of claim 1 wherein the solder ball carrier comprises an elastic slice installed thereon, the lever plate further comprising an elastic slice hole, wherein the elastic slice of the solder ball carrier is capable of inserting into the elastic slice hole of the lever plate, such that the lever plate can be fixed under the solder ball carrier.

5. The planting device of claim 1 further comprising a base for fixing the supporting frame thereon.

6. The planting device of claim 1 further comprising a chip carrier with a funnel shape, a shape inside the fixture corresponding to a shape of the chip carrier.

7. The planting device of claim 6 wherein the chip carrier is installed with a chip holder for holding a chip ready to be planted with solder balls.

8. The planting device of claim 7 wherein a shape and size of the chip holder is approximately identical to a shape and size of the chip.

9. The planting device of claim 7 wherein a thickness of the chip holder is slighter less shallow than a thickness of the chip.

10. The planting device of claim 7 wherein the chip holder comprises four chip extracting holes respectively disposed on four corners of the chip holder.

11. The planting device of claim 1 further comprising a container connector installed on the main board for connecting to a container containing solder balls, all the apertures of the main board being confined inside the container connector, 12. The planting device of claim 1 wherein the adhesive is flux.

* * * * *